(12) United States Patent
Bai et al.

(10) Patent No.: US 12,154,523 B2
(45) Date of Patent: Nov. 26, 2024

(54) DISPLAY PANEL

(71) Applicant: TCL China Star Optoelectronics Technology Co., Ltd., Guangdong (CN)

(72) Inventors: Yichen Bai, Guangdong (CN); Yoonsung Um, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/613,118

(22) PCT Filed: Oct. 22, 2021

(86) PCT No.: PCT/CN2021/125733
§ 371 (c)(1),
(2) Date: Nov. 22, 2021

(87) PCT Pub. No.: WO2023/035370
PCT Pub. Date: Mar. 16, 2023

(65) Prior Publication Data
US 2024/0038190 A1 Feb. 1, 2024

(30) Foreign Application Priority Data
Sep. 13, 2021 (CN) .......................... 202111067900.4

(51) Int. Cl.
*G09G 3/36* (2006.01)
*G02F 1/1362* (2006.01)
*H01L 27/12* (2006.01)

(52) U.S. Cl.
CPC ..... *G09G 3/3614* (2013.01); *G02F 1/136286* (2013.01); *H01L 27/124* (2013.01); *G09G 2320/0209* (2013.01)

(58) Field of Classification Search
CPC .......... G09G 3/3614; G09G 2320/0209; G02F 1/136286; H01L 27/124
See application file for complete search history.

(56) References Cited

U.S. PATENT DOCUMENTS

| 11,776,447 | B2* | 10/2023 | Kim ..................... | G09G 3/2003 345/691 |
| 2010/0110114 | A1* | 5/2010 | Hashimoto .......... | G09G 3/3614 345/88 |
| 2010/0123652 | A1* | 5/2010 | Chen .................... | G09G 3/3648 345/98 |
| 2018/0357970 | A1 | 12/2018 | Bae et al. | |
| 2020/0380928 | A1 | 12/2020 | Chang et al. | |

(Continued)

FOREIGN PATENT DOCUMENTS

| CN | 101510035 | 8/2009 |
| CN | 103901685 | 7/2014 |

(Continued)

*Primary Examiner* — Md Saiful A Siddiqui

(57) ABSTRACT

A display panel is provided. The display panel includes a plurality of pixels, a first main data line, a first sub data line, and a first connecting line. The first main data line is electrically connected to pixels arranged in at least two columns. The first sub data line and the first main data line are separated by M columns of pixels, and the first sub data line is electrically connected to pixels arranged in at least two other columns. The first connecting line connects the first main data line and the first sub data line.

15 Claims, 3 Drawing Sheets

(56) References Cited

U.S. PATENT DOCUMENTS

2021/0019035 A1      1/2021  Yoo et al.
2021/0364876 A1*   11/2021  Long ................. G02F 1/136286

FOREIGN PATENT DOCUMENTS

| | | |
|---|---|---|
| CN | 105206211 | 12/2015 |
| CN | 105405379 | 3/2016 |
| CN | 106094380 | 11/2016 |
| CN | 106991953 | 7/2017 |
| CN | 107909973 | 4/2018 |
| CN | 209103794 | 7/2019 |
| CN | 110208995 | 9/2019 |
| CN | 110286537 | 9/2019 |
| CN | 110456585 | 11/2019 |
| CN | 110531558 | 12/2019 |
| CN | 111123598 | 5/2020 |
| CN | 111223464 | 6/2020 |
| CN | 111323977 | 6/2020 |
| CN | 111323977 A * | 6/2020 |
| TW | 201142448 | 12/2011 |

\* cited by examiner

DISPLAY PANEL

RELATED APPLICATIONS

This application is a National Phase of PCT Patent Application No. PCT/CN2021/125733 having International filing date of Oct. 22, 2021, which claims the benefit of priority of Chinese Patent Application No. 202111067900.4 filed on Sep. 13, 2021. The contents of the above applications are all incorporated by reference as if fully set forth herein in their entirety.

FIELD AND BACKGROUND OF THE INVENTION

The present disclosure relates to the field of display technologies, and in particular to a display panel.

With the development of panel industries, a resolution and a refresh frequency of panels have also increased, but this has also led to an increase in a number of chip on film (COF) installed in a source driver, thereby increasing a risk of COF bonding failure and increasing costs. Thus, a data line share (DLS) structure is proposed. In the DLS structure, the number of COFs is reduced to half of a traditional structure, which reduces a risk of bonding failure and costs caused by disposing multiple COFs.

FIG. 1 shows a schematic diagram of a display panel 10 in the prior art. The display panel 10 includes a plurality of data lines D1-D7, a plurality of gate lines G1-G16, and a plurality of pixels P, where the plurality of pixels includes a plurality of red pixels R, a plurality of green pixels G, and a plurality of blue pixels B. The display panel 10 adopts the DLS structure, that is, pixels in different columns are connected to a same data line. Polarities of signals transmitted by two adjacent data lines are opposite. As shown in FIG. 1, when the display panel 10 displays an image with two columns of red lines and two columns of white lines alternately arranged, pixels arranged in first to third columns display a first column of white line, pixels arranged in fourth to sixth columns display a second column of white line, pixels arranged in a seventh column display a first column of red line, pixels arranged in a tenth column display a second column of red line, and pixels arranged in the other columns are turned off to display black.

However, as shown in FIG. 1, when a first gate line G1 is opened, a ratio of pixels with the positive polarity to pixels with the negative polarity is 3:1. Also, when a eleventh gate line Gil is opened, a ratio of pixels with the positive polarity to pixels with the negative polarity is 1:3. That is, the number of pixels with positive polarity and the number of pixels with negative polarity in the same row of pixels connected to the same gate line are extreme different, which causes a serious horizontal crosstalk problem in the existing DLS structure, which reduces an image quality of the panel.

Accordingly, it is necessary to propose a display panel to solve the problem existing in the prior art.

SUMMARY OF THE INVENTION

In order to solve the above-mentioned problem in the prior art, a purpose of the present disclosure is to provide a display panel to improve a horizontal crosstalk problem of a display panel and improve an image quality of the display panel.

In order to achieve the above purpose, the present disclosure provides a display panel, comprising: a plurality of pixels arranged in an array along a row direction and a column direction; a first main data line extending along the column direction, wherein the first main data line is electrically connected to pixels arranged in at least two columns; a first sub data line extending along the column direction, wherein the first sub data line and the first main data line are separated by M columns of pixels, and the first sub data line is electrically connected to pixels arranged in at least two other columns; a first connecting line connecting the first main data line and the first sub data line; a second main data line extending along the column direction and adjacent to the first main data line; a second sub data line extending along the column direction and adjacent to the first sub data line, wherein the second sub data line and the second main data line are separated by M columns of pixels, and the second main data line and the second sub data line are respectively electrically connected to pixels arranged in at least two columns; a second connecting line connecting the second main data line and the second sub data line, wherein the first main data line and the first sub data line are configured to transmit a signal with a first polarity, and the second main data line and the second sub data line are configured to transmit a signal with a second polarity opposite to the first polarity; and a plurality of gate lines extending along the row direction, wherein two gate lines are arranged between two adjacent rows of pixels, the plurality of gate lines comprise a first gate line and a second gate line, which are respectively arranged on both sides of a first row of pixels, the first gate line and the second gate line are respectively connected to at least one pixel in the first row of pixels, and in the first row of pixels, a number of pixels with the first polarity is equal to a number of pixels with the second polarity.

In some embodiment, the first main data line alternately connects pixels arranged in a first column and pixels arranged in a second column, and the first sub data line alternately connects pixels arranged in an N-th column and pixels arranged in an (N+1)th column; and the second main data line alternately connects the pixels arranged in the second column and pixels arranged in a third column, and the second sub data line alternately connects the pixels arranged in the (N+1)th column and the columns pixels in arranged in an (N+2)th column.

In some embodiment, the first main data line connects a pixel arranged in the first row and the second column and a pixel arranged in a second row and the first column, and the second main data line connects a pixel arranged in the first row and the third column and a pixel arranged in the second row and the second column.

In some embodiment, the first main data line is electrically connected to pixels arranged in four columns, and the first sub data line is electrically connected to pixels arranged in another four columns; in odd-numbered rows of pixels, the first main data line and the first sub data line are electrically connected to pixels arranged in two columns of the corresponding four columns; and in even-numbered rows of pixels, the first main data line and the first sub data line are electrically connected to pixels arranged in the other two columns of the corresponding four columns.

In some embodiment, in the odd-numbered rows of pixels, the first main data line is electrically connected to the pixels arranged in second and third columns of the corresponding four columns, and the first sub data line is electrically connected to the pixels arranged in first and fourth columns of the corresponding four columns; and in the even-numbered rows of pixels, the first main data line is electrically connected to the pixels arranged in first and fourth columns of the corresponding four columns, and the first sub data line is electrically connected to the pixels arranged in second and third columns of the corresponding four columns.

In some embodiment, the second main data line is electrically connected to pixels arranged in four columns, and the second sub data line is electrically connected to pixels arranged in another four columns; in the odd-numbered rows of pixels, the second main data line and the second sub data line are electrically connected to pixels arranged in two columns of the corresponding four columns; and in the even-numbered rows of pixels, the second main data line and the second sub data line are electrically connected to the pixels arranged in the other two columns of the corresponding four columns.

In some embodiment, the first main data line is electrically connected to pixels arranged in an X-th column, an (X+1)th column, an (X+2)th column, and an (X+3)th column, and the second main data line is electrically connected to pixels arranged in the (X+2)th column, the (X+3)th column, an (X+4)th column, and an (X+5)th column; in the odd-numbered rows of pixels, the first main data line is electrically connected to the pixels arranged in the (X+1)th column and the (X+2)th column, and the second main data line is electrically connected to the pixels arranged in the (X+3)th column and the (X+5)th column; and in the even-numbered rows of pixels, the first main data line is electrically connected to the pixels arranged in the X-th column and the (X+3)th column, and the second main data line is electrically connected to the pixels arranged in the (X+2)th column and the (X+4)th column.

In some embodiment, the display panel further includes: a source driver; and a wiring connecting the source driver and the first main data line, wherein the first connecting line is disposed between one end of the wiring and the first row of pixels, and the end is a connecting end of the wiring and the first main data line.

The present disclosure also provides a display panel, comprising: a plurality of pixels arranged in an array along a row direction and a column direction; a first main data line extending along the column direction, wherein the first main data line is electrically connected to pixels arranged in at least two columns; a first sub data line extending along the column direction, wherein the first sub data line and the first main data line are separated by M columns of pixels, and the first sub data line is electrically connected to pixels arranged in at least two other columns; and a first connecting line connecting the first main data line and the first sub data line.

In some embodiment, the display panel further includes: a second main data line extending along the column direction and adjacent to the first main data line; a second sub data line extending along the column direction and adjacent to the first sub data line, wherein the second sub data line and the second main data line are separated by M columns of pixels, and the second main data line and the second sub data line are respectively electrically connected to pixels arranged in at least two columns; and a second connecting line connecting the second main data line and the second sub data line, wherein the first main data line and the first sub data line are configured to transmit a signal with a first polarity, and the second main data line and the second sub data line are configured to transmit a signal with a second polarity opposite to the first polarity.

In some embodiment, the first main data line alternately connects pixels arranged in a first column and pixels arranged in a second column, and the first sub data line alternately connects pixels arranged in an N-th column and pixels arranged in an (N+1)th column; and the second main data line alternately connects the pixels arranged in the second column and pixels arranged in a third column, and the second sub data line alternately connects the pixels arranged in the (N+1)th column and the columns pixels in arranged in an (N+2)th column.

In some embodiment, the first main data line connects a pixel arranged in the first row and the second column and a pixel arranged in a second row and the first column, and the second main data line connects a pixel arranged in the first row and the third column and a pixel arranged in the second row and the second column.

In some embodiment, the first main data line is electrically connected to pixels arranged in four columns, and the first sub data line is electrically connected to pixels arranged in another four columns;
in odd-numbered rows of pixels, the first main data line and the first sub data line are electrically connected to pixels arranged in two columns of the corresponding four columns; and in even-numbered rows of pixels, the first main data line and the first sub data line are electrically connected to pixels arranged in the other two columns of the corresponding four columns.

In some embodiment, in the odd-numbered rows of pixels, the first main data line is electrically connected to the pixels arranged in second and third columns of the corresponding four columns, and the first sub data line is electrically connected to the pixels arranged in first and fourth columns of the corresponding four columns; and in the even-numbered rows of pixels, the first main data line is electrically connected to the pixels arranged in first and fourth columns of the corresponding four columns, and the first sub data line is electrically connected to the pixels arranged in second and third columns of the corresponding four columns.

In some embodiment, the second main data line is electrically connected to pixels arranged in four columns, and the second sub data line is electrically connected to pixels arranged in another four columns; in the odd-numbered rows of pixels, the second main data line and the second sub data line are electrically connected to pixels arranged in two columns of the corresponding four columns; and in the even-numbered rows of pixels, the second main data line and the second sub data line are electrically connected to the pixels arranged in the other two columns of the corresponding four columns.

In some embodiment, the first main data line is electrically connected to pixels arranged in an X-th column, an (X+1)th column, an (X+2)th column, and an (X+3)th column, and the second main data line is electrically connected to pixels arranged in the (X+2)th column, the (X+3)th column, an (X+4)th column, and an (X+5)th column; in the odd-numbered rows of pixels, the first main data line is electrically connected to the pixels arranged in the (X+1)th column and the (X+2)th column, and the second main data line is electrically connected to the pixels arranged in the (X+3)th column and the (X+5)th column; and in the even-numbered rows of pixels, the first main data line is electrically connected to the pixels arranged in the X-th column and the (X+3)th column, and the second main data line is electrically connected to the pixels arranged in the (X+2)th column and the (X+4)th column.

In some embodiment, the display panel further includes: a source driver; and a wiring connecting the source driver and the first main data line, wherein the first connecting line is disposed between one end of the wiring and the first row of pixels, and the end is a connecting end of the wiring and the first main data line.

In some embodiment, the display panel further includes: a plurality of gate lines extending along the row direction, wherein two gate lines are arranged between two adjacent rows of pixels; the plurality of gate lines comprise a first gate line and a second gate line, which are respectively arranged on both sides of a first row of pixels, the first gate line and the second gate line are respectively connected to at least one pixel in the first row of pixels; and in the first row of pixels, a number of pixels with the first polarity is equal to a number of pixels with the second polarity.

In comparison with the prior art, the present disclosure provides the sub data lines connected to the main data lines in the display panel, a smaller number of connectors used to connect the source driver and the display panel is adopted, and the number of pixels with the positive polarity is similar to the number of pixels with the negative polarity in the same row, thereby preventing the crosstalk problem of the display panel and improving the image quality of the display panel.

BRIEF DESCRIPTION OF THE SEVERAL VIEWS OF THE DRAWINGS

The following describes the specific embodiments of the present disclosure in detail with reference to accompanying drawings to make technical solutions and other beneficial effects of the present disclosure obvious.

DESCRIPTION OF SPECIFIC EMBODIMENTS OF THE INVENTION

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure.

Figure 1:
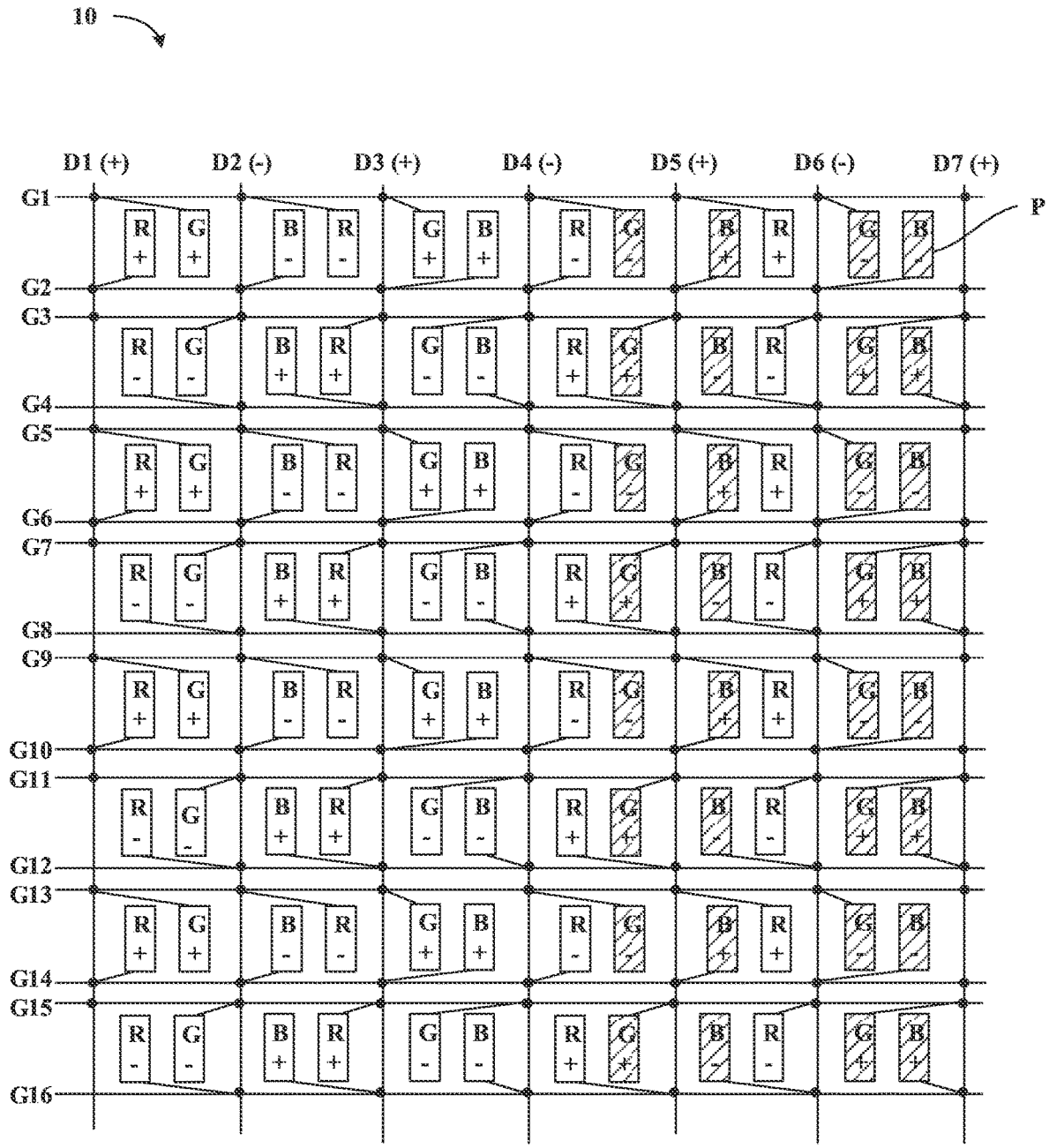
FIG. 1 shows a schematic diagram of a display panel in the prior art.
Figure 2:
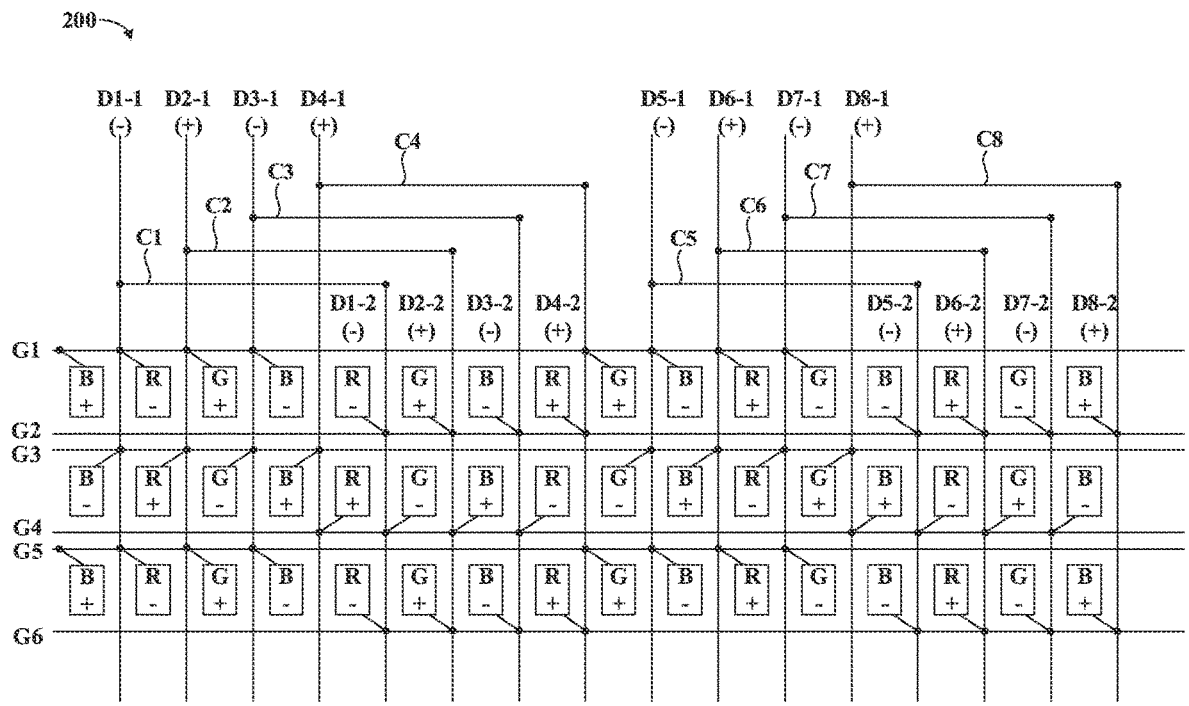
FIG. 2 shows a schematic diagram of a pixel circuit of a display panel according to a first embodiment of the present disclosure.

Referring to FIG. 2, which shows a schematic diagram of a pixel circuit of a display panel 200 according to a first embodiment of the present disclosure. The display panel 200 includes a plurality of pixels, a plurality of data lines (including main data lines D1-1 to D8-1, sub data lines D1-2 to D8-2, a plurality of connecting lines C1-C8), and a plurality of gate lines G1-G6. The plurality of pixels are arranged in an arrayed along a row direction and a column direction, and include red pixels R, green pixels G, and blue pixels B. The plurality of data lines extend along the column direction, and the plurality of gate lines extend along the row direction.

As shown in FIG. 2, each data line includes a main data line, a sub data line, and a connecting line. For example, a first data line includes a first main data line D1-1, a first sub data line D1-2, and a first connecting line C1. A second data line includes a second main data line D2-1, a second sub data line D2-2, and a second connecting line C2. The first main data line D1-1 and the first sub data line D1-2 are connected through the first connecting line C1. The second main data line D2-1 and the second sub data line D2-2 are connected through the second connecting line C2. The first main data line D1-1 and the second main data line D2-1 are adjacent. The first sub data line D1-2 and the second sub data line D2-2 are adjacent. It should be noted that the first data line is not limited to the first data line arranged in the display panel 200, and can be any one of the data lines. That is, the first data line and the second data line should be understood as any two adjacent data lines in the display panel 200.

As shown in FIG. 2, the first main data line D1-1 and the first sub data line D1-2 are separated by M columns of pixels. The second main data line D2-1 and the second sub data line D2-2 are also separated by M columns of pixels, where M is a positive integer greater than or equal to 1. In this embodiment, M is 4, that is, the connected main data line and the sub data line are separated by four columns of pixels. In some embodiments, M is preferably less than or equal to 2, which can effectively prevent a risk of electrostatic discharge (ESD) and the decrease in a charging speed of the pixel P caused by excessive crossover line design in the connecting line connecting the main data line and the sub data line.

In this embodiment, in a group of connected data lines, the main data line is electrically connected to pixels arranged in at least two columns, and the sub data line is electrically connected to pixels arranged in at least two other columns. It should be understood that the connection of the data line to the pixels arranged in a specific column means to connect to at least one pixel arranged in the column, rather than to connect to all the pixels arranged in the column. As shown in FIG. 2, the main data line or the sub data line alternately connects pixels arranged in two columns. For example, the first main data line D1-1 is arranged between the pixels in a first column and the pixels in the second column, and the first main data line D1-1 alternately connects the pixels arranged in the first column and the pixels arranged in the second column. In addition, the first sub data line D1-2 is arranged between the pixels in an N-th column and the pixels in an (N+1)th column, and the first sub data line D1-2 alternately connects the pixels arranged in the N-th column and the pixels arranged in the (N+1)th column, where N is a positive integer greater than or equal to 1. In this embodiment, N is 5. That is, the first sub data line D1-2 is arranged between the pixels in a fifth column and the pixels in a sixth column, and alternately connects the pixels arranged in the fifth column and the pixels arranged in the sixth column. The second main data line D2-1 is arranged between the pixels in a second column and the pixels in a third column, and the second main data line D2-1 alternately connects the pixels arranged in the second column and the pixels arranged in the third column. In addition, the second sub data line D2-2 is arranged between the pixels in the sixth column and the pixels in a seventh column, and the second sub data line D2-2 alternately connects the pixels arranged in the sixth column and the pixels arranged in the seventh column.

It should be understood that, in this embodiment, the alternate connection of the data line means that the data line connects odd-numbered rows of pixels or even-numbered rows of pixels in the same column of pixels. That is, the alternate connection includes that a same data line is connected to odd-numbered rows of pixels in one column of pixels and connected to even-numbered rows of pixels in another adjacent column of pixels, a same data line is connected to odd-numbered rows of pixels in two adjacent columns of pixels, and a same data line is connected to even-numbered rows of pixels in two adjacent columns of pixels. As shown in FIG. 2, the first main data line D1-1 connects a pixel arranged in a first row and the second column and a pixel arranged in a second row and the first column. Thus, for the first main data line D1-1, the alternate connection of the data line means that the first main data line D1-1 is connected to the even-numbered rows of pixels in the first column of pixels and connected to the odd-numbered rows of pixels in the second column of pixels. Similarly, the second main data line D2-1 connects a pixel arranged in the first row and a third column and a pixel arranged in the second row and second column. For the second main data line D2-1, the alternate connection of the data line means that the second main data line D2-1 is connected to the even-numbered rows of pixels in the second column of pixels and connected to the odd-numbered rows of pixels in the third column of pixels.

As shown in FIG. 2, the pixels arranged in the same row are controlled by two adjacent gate lines, and the two gate lines are arranged between the two adjacent rows of pixels. For example, the first row of the pixels are disposed between a first gate line G1 and a second gate line G2, and the second gate line G2 and a third gate line G3 are disposed between the first row of the pixels and the second row of pixels. In this embodiment, the pixels of the same row are correspondingly connected to two adjacent gate lines. For example, the first gate line G1 is correspondingly connected to at least one pixel in the first row of pixels, and the second gate line G2 is correspondingly connected to at least another pixel in the first row of pixels. Similarly, the third gate line G3 is correspondingly connected to at least one pixel in the second row of pixels, and a fourth gate line G4 is correspondingly connected to at least one pixel in the second row of pixels. It should be understood that the corresponding connections of gate lines include ordered or disordered connections, that is, two adjacent gate lines can be connected to the pixels arranged in the same row with the same or different number of pixels as intervals. As shown in FIG. 2, in a row of pixels, four pixels as a group are alternately connected with two adjacent gate lines. For example, the first gate line G1 is connected to the pixels in the first to fourth columns and the ninth to twelfth columns in the first row of pixels. The second gate line G2 is connected to the pixels in the fifth to eighth columns and the thirteenth to sixteenth columns in the first row of pixels. In some embodiments, two adjacent gate lines can be connected to the pixels arranged in the same row with the same or different number of pixels as intervals.

In this embodiment, the same data line alternately connects pixels arranged in different columns and the same row of pixels correspondingly connects to two adjacent gate lines, thereby realizing a data line sharing (DLS) structure. Therefore, in this embodiment, the number of connectors used to connect the source driver and the display panel can be reduced to half of a traditional structure, thereby reducing a risk of bonding failure and costs caused by disposing multiple connectors.

It should be understood that, in this embodiment, the display panel 200 includes a liquid crystal. A liquid crystal cell corresponding to each pixel has its own signal polarity. In order to prevent the polarization of the liquid crystal, it is necessary to drive the liquid crystal cell by alternately changing a polarity electric field. That is, a polarity of a voltage applied to each liquid crystal cell is inversed during two consecutive frames. For the liquid crystal cell, if the voltage polarity is driven positive in a current time frame, the voltage polarity is then driven negative in a next time frame.

As shown in FIG. 2, the main data line and the connected sub data line are configured to transmit signals with a same polarity, and two adjacent data lines are configured to transmit signals with an opposite polarity. For example, the first main data line D1-1 and the first sub data line D1-2 are configured to transmit signals with a first polarity, and the second main data line D2-1 and the second sub data line D2-2 are configured to transmit signals with a second polarity opposite to the first polarity, and so on. As shown in FIG. 2, when the first main data line D1-1 and the first sub data line D1-2 are configured to transmit signals with a negative polarity, the second main data line D2-1 and the second sub data line D2-2 are configured to transmit signals with a positive polarity.

As shown in FIG. 2, the pixels in the same column are the same color. Moreover, the polarities of two adjacent pixels in the same column of pixels are opposite. For example, when the first main data line D1-1 and first sub data line D1-2 are configured to transmit signals with the negative polarity, the pixel arranged in the first row and the first column has the positive polarity, the pixel arranged in the second row and first column has the negative polarity, the pixel arranged in the third row and the first column has the positive polarity, and so on.

A cause of a horizontal crosstalk of a special image is strongly related to the polarities of the pixels. In a displayed image, the closer the number of the pixels with the positive polarity and the pixels with the negative polarity in the same row of pixels, a coupling capacitance with the common electrode can be eliminated, and the horizontal crosstalk of the display panel will be lighter.

Therefore, as shown in FIG. 2, in the same row of pixels, the polarities of pixels present an arrangement rule of "−+−−+−++" or "+−++−+−−". When displaying a special image, in the same row of pixels, if two adjacent pixels have opposite column inversion voltage polarity patterns, an overall perceived crosstalk can be reduced. For example, when the display panel 200 displays a special image with two rows of red lines and two rows of white lines alternately arranged, a special image with a row of red line and two rows of white lines alternately arranged, or a special image with a row of white line and a row of black line alternately arranged, in the pixels arranged in the same row and connected to the same gate line, the number of the pixels with the positive polarity is the same as the number of the pixels with the negative polarity. Also, when the display panel 200 displays a special image with multiple W characters in succession, in the pixels connected to the same gate line and arranged in the same row, a ratio of the pixels with the positive polarity to the pixels with the negative polarity ranges from ¾ to 1. When the display panel 200 displays a special image with two rows of white lines and two rows of black lines alternately arranged, in the pixels connected to the same gate line and arranged in the same row, a ratio of the pixels with the positive polarity to the pixels with the negative polarity ranges from ⅔ to ¾. It can be seen that when the display panel 200 displays the above-mentioned five special images, the risk of horizontal crosstalk is low, thereby improving the image quality of the display panel. In addition, in the same row of pixels, every time one or two pixels are separated, the polarity of the pixels is inversed, that is, a (1+2) dot inversion drive of the row direction is realized.

It should be understood that if voltages applied to two adjacent pixels are the same but opposite in polarity, the coupling capacitance with the common electrode can be eliminated, thereby preventing the crosstalk. Specifically, the coupling capacitance is generated between the pixel and the data line, and a value of the coupling capacitance is inversely proportional to a distance between the pixel and the data line. In other words, the greater the distance between pixel and the data line, the smaller the value of the capacitance of the two. As shown in FIG. 2, because opposite sides of each pixel are adjacent to the data lines, and there is no other pixel between one side of the pixel and the data line. Two adjacent data lines are configured to transmit signals of opposite polarities. Thus, the polarities of the coupling capacitances on both sides of each pixel are opposite, so that the coupling capacitance between each pixel and one of the data lines is similar to the coupling capacitance between the pixel and the other data line. Therefore, the present disclosure can improve the problem of poor image quality and vertical crosstalk caused by the large difference between the distances between both sides of the pixels and the two adjacent data lines, and unequal coupling capacitances on both sides of the pixel.

Figure 3:
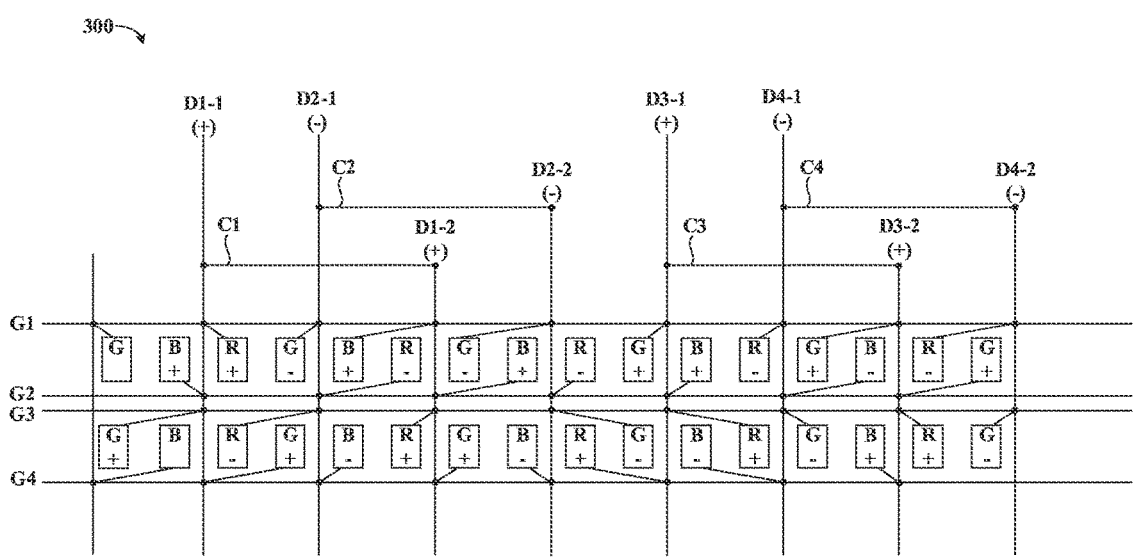
FIG. 3 shows a schematic diagram of a pixel circuit of a display panel according to a second embodiment of the present disclosure.

Referring to FIG. 3, which shows a schematic diagram of a pixel circuit of a display panel 300 according to a second embodiment of the present disclosure. The display panel 300 includes a plurality of pixels, a plurality of data lines (including main data lines D1-1 to D4-1, sub data lines D1-2 to D4-2, a plurality of connecting lines C1-C4), and a plurality of gate lines G1-G4. The plurality of pixels are arranged in an arrayed along the row direction and the column direction, and include red pixels R, green pixels G, and blue pixels B. The plurality of data lines extend along the column direction. The plurality of gate lines extend along the row direction.

As shown in FIG. 3, each data line includes a main data line, a sub data line, and a connecting line. For example, a first data line includes a first main data line D1-1, a first sub data line D1-2, and a first connecting line C1. A second data line includes a second main data line D2-1, a second sub data line D2-2, and a second connecting line C2. The first main data line D1-1 and the first sub data line D1-2 are connected through the first connecting line C1. The second main data line D2-1 and the second sub data line D2-2 are connected through the second connecting line C2. The first main data line D1-1 and the second main data line D2-1 are adjacent. The first sub data line D1-2 and the second sub data line D2-2 are adjacent. It should be noted that the first data line is not limited to the first data line arranged in the display panel 300, and can be any one of the data lines. That is, the first data line and the second data line should be understood as any two adjacent data lines in the display panel 300.

As shown in FIG. 3, the first main data line D1-1 and the first sub data line D1-2 are separated by M columns of pixels. The second main data line D2-1 and the second sub data line D2-2 are also separated by M columns of pixels. In this embodiment, M is 4, that is, the connected main data line and the sub data line are separated by four columns of pixels. In some embodiments, M is preferably less than or equal to 2, which can effectively prevent a risk of electrostatic discharge and the decrease in a charging speed of the pixel P caused by excessive crossover line design in the connecting line connecting the main data line and the sub data line.

As shown in FIG. 3, in this embodiment, in a group of connected data lines, the main data line is electrically connected to pixels arranged in four columns, and the sub data line is electrically connected to pixels arranged in another four columns. For example, the first main data line D1-1 is electrically connected to the pixels arranged in a first column to a fourth column. The first sub data line D1-2 is electrically connected to the pixels arranged in an N-th column to an (N+3)th column. In this embodiment, N is 5. That is, the first sub data line D1-2 is electrically connected to the pixels arranged in a fifth column to an eighth column.

As shown in FIG. 3, in odd-numbered rows of pixels, the main data line and the connected sub data line are electrically connected to the pixels arranged in two columns of the corresponding four columns. In even-numbered rows of pixels, the main data line and the connected sub data line are electrically connected to the pixels arranged in the other two columns of the corresponding four columns. For example, in the odd-numbered rows of pixels, the first main data line D1-1 is electrically connected to the pixels arranged in second and third columns of the corresponding four columns, and the first sub data line D1-2 is electrically connected to the pixels arranged in first and fourth columns of the corresponding four columns. Moreover, in the odd rows of pixels, the second main data line D2-1 is electrically connected to the pixels arranged in second and fourth columns of the corresponding four columns, and the second sub data line D2-2 is electrically connected to the pixels arranged in first and third columns of the corresponding four columns. In the even-numbered rows of pixels, the first main data line D1-1 is electrically connected to the pixels arranged in first and fourth columns of the corresponding four columns, and the first sub data line D1-2 is electrically connected to the pixels arranged in second and third columns of the corresponding four columns. Moreover, in the even-numbered rows of pixels, the second main data line D2-1 is electrically connected to the pixels arranged in first and third columns of the corresponding four columns, and the second sub data line D2-2 is electrically connected to the pixels arranged in second and fourth columns of the corresponding four columns.

As shown in FIG. 3, the pixels arranged in the same column are connected to different data lines. One of the main or sub data line is electrically connected to the pixels arranged in an X-th column, an (X+1)th column, an (X+2)th column, and an (X+3)th column, and another adjacent main or sub data line is electrically connected to the pixels arranged in the (X+2)th column, the (X+3)th column, an (X+4)th column, and an (X+5)th column, where X is a positive integer greater than or equal to 1. For example, the first main data line D1-1 is electrically connected to the pixels arranged in a first column to a fourth column, and the second main data line D2-1 is electrically connected to the pixels arranged in a third column to a sixth column. Also, the first sub data line D1-2 is electrically connected to the pixels arranged in a fifth column to an eighth column, and the second sub data line D2-2 is electrically connected to the pixels arranged in a seventh column to a tenth column. In the odd-numbered rows of pixels, the first main data line D1-1 is electrically connected to the pixels arranged in the second and third columns, the second main data line D2-1 is electrically connected to the pixels arranged in the fourth column and the sixth column, the first sub data line D1-2 is electrically connected to the pixels arranged in the fifth column and the eighth column, and the second sub data line D2-2 is electrically connected to the pixels arranged in the seventh column and the ninth column. In the even-numbered rows of pixels, the first main data line D1-1 is electrically connected to the pixels arranged in the first and fourth columns, the second main data line D2-1 is electrically connected to the pixels arranged in the third and fifth columns, the first sub data line D1-2 is electrically connected to the pixels arranged in the sixth column and the seventh column, and the second sub data line D2-2 is electrically connected to the pixels arranged in the eighth column and the tenth column.

As shown in FIG. 3, the pixels arranged in the same row are controlled by two adjacent gate lines, and the two gate lines are arranged between the two adjacent rows of pixels. For example, the first row of the pixels are disposed between a first gate line G1 and a second gate line G2, and the second gate line G2 and a third gate line G3 are disposed between the first row of the pixels and the second row of pixels. In this embodiment, the pixels of the same row are correspondingly connected to two adjacent gate lines. For example, the first gate line G1 is correspondingly connected to at least one pixel in the first row of pixels, and the second gate line G2 is correspondingly connected to at least another pixel in the first row of pixels. Similarly, the third gate line G3 is correspondingly connected to at least one pixel in the second row of pixels, and a fourth gate line G4 is correspondingly connected to at least one pixel in the second row of pixels. It should be understood that the corresponding connections of gate lines include ordered or disordered connections, that is, two adjacent gate lines can be connected to the pixels arranged in the same row with the same or different number of pixels as intervals. In this embodiment, the same data line alternately connects pixels arranged in different columns and the same row of pixels correspondingly connects to two adjacent gate lines, thereby realizing a data line sharing structure. Therefore, in this embodiment, the number of connectors used to connect the source driver and the display panel can be reduced to half of a traditional structure, thereby reducing a risk of bonding failure and costs caused by disposing multiple connectors.

It should be understood that, in this embodiment, the display panel 300 includes a liquid crystal. A liquid crystal cell corresponding to each pixel has its own signal polarity. In order to prevent the polarization of the liquid crystal, it is necessary to drive the liquid crystal cell by alternately changing a polarity electric field. That is, a polarity of a voltage applied to each liquid crystal cell is inversed during two consecutive frames. For the liquid crystal cell, if the voltage polarity is driven positive in a current time frame, the voltage polarity is then driven negative in a next time frame.

As shown in FIG. 3, the main data line and the connected sub data line are configured to transmit signals with a same polarity, and two adjacent data lines are configured to transmit signals with an opposite polarity. For example, the first main data line D1-1 and the first sub data line D1-2 are configured to transmit signals with a first polarity, and the second main data line D2-1 and the second sub data line D2-2 are configured to transmit signals with a second polarity opposite to the first polarity, and so on. As shown in FIG. 3, when the first main data line D1-1 and the first sub data line D1-2 are configured to transmit signals with a positive polarity, the second main data line D2-1 and the second sub data line D2-2 are configured to transmit signals with a negative polarity.

A cause of a horizontal crosstalk of a special image is strongly related to the polarities of the pixels. In a displayed image, the closer the number of the pixels with the positive polarity and the pixels with the negative polarity in the same row of pixels, a coupling capacitance with the common electrode can be eliminated, and the horizontal crosstalk of the display panel will be lighter.

Therefore, as shown in FIG. 3, the pixels in the same column have the same color, and the polarities of two adjacent pixels in the same column are opposite. Moreover, in the same row of pixels, the polarities of pixels present an arrangement rule of "−+−−+−++" or "+−++−+−−". When displaying a special image, in the same row of pixels, if two adjacent pixels have opposite column inversion voltage polarity patterns, an overall perceived crosstalk can be reduced. For example, when the display panel 300 displays a special image with a row of red line and two rows of white lines alternately arranged, a special image with a row of white line and a row of black line alternately arranged, or a special image with two rows of white lines and two rows of black lines alternately arranged, in the pixels arranged in the same row and connected to the same gate line, the number of the pixels with the positive polarity is the same as the number of the pixels with the negative polarity. Also, when the display panel 300 displays a special image with multiple W characters in succession, in the pixels connected to the same gate line and arranged in the same row, a ratio of the pixels with the positive polarity to the pixels with the negative polarity ranges from ¾ to 1. It can be seen that when the display panel 300 displays the above-mentioned five special images, the risk of horizontal crosstalk is low, thereby improving the image quality of the display panel. In addition, in the same row of pixels, every time one or two pixels are separated, the polarity of the pixels is inversed, that is, a (1+2) dot inversion drive of the row direction is realized.

Figure 4:
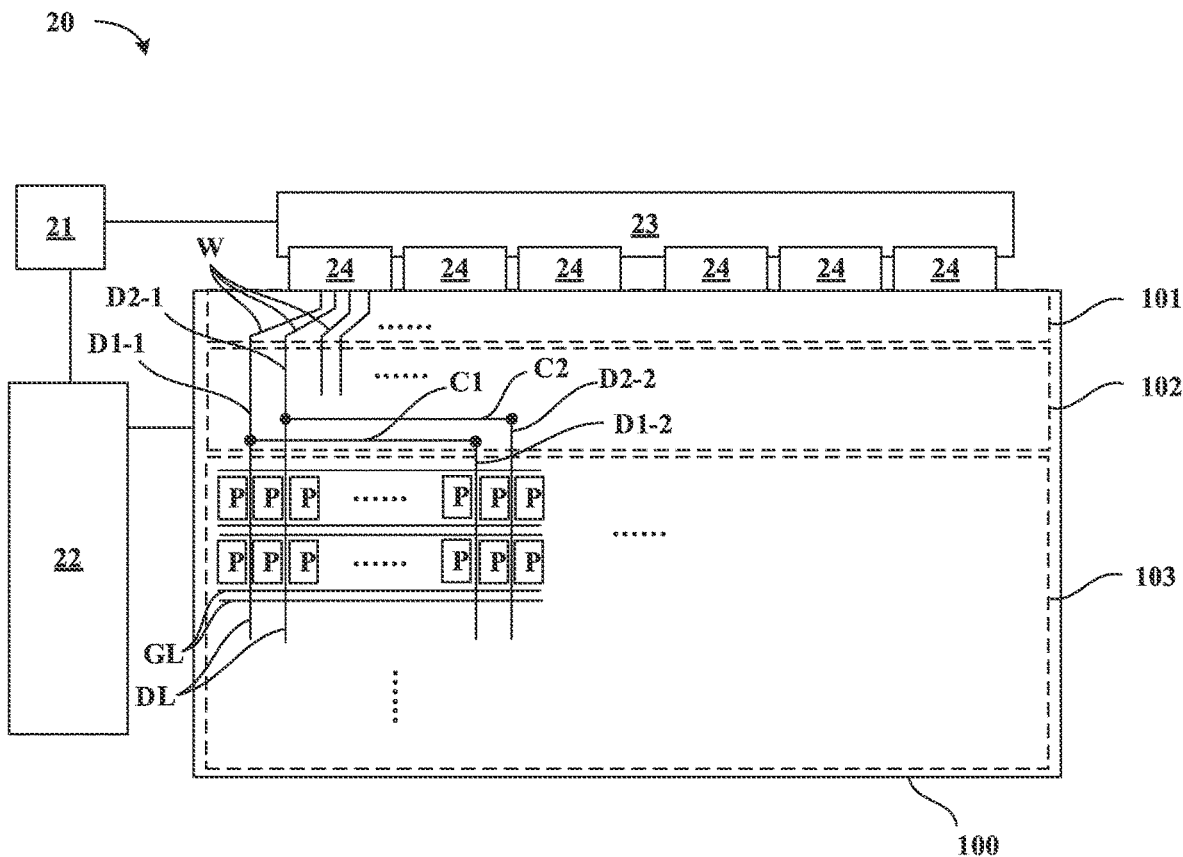
FIG. 4 shows a schematic diagram of a display device according to an embodiment of the present disclosure.

Referring to FIG. 4, which shows a schematic diagram of a display device according to an embodiment of the present disclosure. The display device 20 includes a display panel 100, a controller 21, a gate driver 22, a source driver 23, and a plurality of connectors 24. The display panel 100 includes a fan-out area 101, a connection area 102 and a display area 103. The connection area 102 is between the fan-out area 101 and the display area 103. It should be understood that the display panel 100 may be the display panel 200 of the above-mentioned first embodiment or the display panel 300 of the above-mentioned second embodiment. The display panel 200 of FIG. 2 and the display panel 300 of FIG. 3 only show the connection area and the display area corresponding to the display panel 100 of FIG. 4.

As shown in FIG. 4, the controller 21 is connected to a power supply to provide power to the display device 20, and then controls the display device 20 to be turned on or off. The controller 21 may include a timing controller, a microprocessor, a gamma voltage generator, and so on. The controller 21 is connected to the gate driver 22 and the source driver 23, and the gate driver 22 and the source driver 23 are connected to the display panel 100. The connector 24 is configured to bond the source driver 23 to the display panel 100. The connector 24 may include, but is not limited to, chip on film (COF). The display panel 100 includes a plurality of data lines DL, a plurality of gate lines GL, and a plurality of pixels P. The plurality of data lines DL extend along the column direction, the plurality of gate lines GL extend along the row direction, and the plurality of pixels P arranged in an array along the row direction and the column direction.

As shown in FIG. 4, the source driver 23 is correspondingly connected with the plurality of pixels P through the plurality of data lines DL. The gate driver 22 is connected to the plurality of pixels P through the plurality of gate lines GL. The plurality of pixels P include pixels of different colors, such as red pixels, green pixels, blue pixels, or white pixels, which are configured to emit red, green, blue, or white light correspondingly. It should be noted that one column or more than one column of pixels P may be disposed between two adjacent data lines DL of the display panel 100.

As shown in FIG. 4, the controller 21 is configured to generate a gate control signal and a data control signal. The gate driver 22 generates a gate signal according to the gate control signal, and transmits the gate signal to the plurality of pixels P through the plurality of gate lines GL. On the other hand, the controller 21 transmits the data control signal (e.g., analog video signals, reference gamma voltage signals, etc.) to the source driver 23. The source driver 23 generates a corresponding data signal according to the data control signal, and transmits the data signal to the plurality of pixels P through the plurality of data lines DL.

As shown in FIG. 4, a plurality of wirings W are disposed on the fan-out area 101. The plurality of data lines DL and the plurality of connecting lines (e.g., the first connecting line C1 and the second connecting line C2) are disposed on the connection area 102. The plurality of pixels P, the plurality of data lines DL, and the plurality of gate lines GL are disposed on the display area 103. The plurality of data lines DL extend from the connection area 102 to the display area 103. The plurality of wirings W in the fan-out area 101 are configured to connect the source driver 23 and the main data lines (such as, the first main data line D1-1, the second main data line D2-1, etc.) of the corresponding plurality of data lines DL through the connectors 24. When the display device 20 is turned on, the controller 21 obtains image data signals related to one frame of image to generate corresponding gate control signals and data control signals, and then controls the display area 103 of the display panel 100 to display images.

As shown in FIG. 4, in this embodiment, the connecting lines connecting the main data lines and the sub data lines are disposed in the connection area 102. Specifically, the connecting lines are disposed between the plurality of wirings W in the fan-out area 101 and the pixels P in the first row of the display area 103. That is, each of the connecting lines is disposed between one end of the wiring W and the pixels P in the first row, and the end is a connecting end of the wiring W and the corresponding main data line. By setting the connecting line in the connection area 102 instead of the fan-out area 101, it is possible to prevent the risk of ESD and the decrease in a charging speed of the pixel P due to a dense circuit layout of the fan-out area 101.

In summary, the present disclosure provides the sub data lines connected to the main data lines in the display panel, the number of connectors used to connect the source driver and the display panel can be reduced to half of a traditional structure, thereby reducing a risk of bonding failure and costs caused by disposing multiple connectors. Furthermore, the pixel circuit of the display panel of the present disclosure can realize that the number of pixels with the positive polarity is similar to the number of pixels with the negative polarity in the same row, thereby preventing the crosstalk problem of the display panel and improving the image quality of the display panel.

The above describes in detail a display panel of the embodiments of the present disclosure. Specific embodiments are used in this specification to illustrate the principle and implementation of the present disclosure. The description of the above embodiments is only used to help understand the technical solutions of the present disclosure and its core idea. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present disclosure.

What is claimed is:

1. A display panel, comprising:
   a plurality of pixels arranged in an array along a row direction and a column direction;
   a first main data line extending along the column direction, wherein the first main data line is electrically connected to pixels arranged in at least two columns;
   a first sub data line extending along the column direction, wherein the first sub data line and the first main data line are separated by M columns of pixels, and the first sub data line is electrically connected to pixels arranged in at least two other columns, wherein M is a positive integer greater than or equal to 1;
   a first connecting line connecting the first main data line and the first sub data line;
   a second main data line extending along the column direction and adjacent to the first main data line;
   a second sub data line extending along the column direction and adjacent to the first sub data line, wherein the second sub data line and the second main data line are separated by M columns of pixels, and the second main data line and the second sub data line are respectively electrically connected to pixels arranged in at least two columns;
   a second connecting line connecting the second main data line and the second sub data line, wherein the first main data line and the first sub data line are configured to transmit a signal with a first polarity, and the second main data line and the second sub data line are configured to transmit a signal with a second polarity opposite to the first polarity; and
   a plurality of gate lines extending along the row direction, wherein two gate lines are arranged between two adjacent rows of pixels, the plurality of gate lines comprise a first gate line and a second gate line, which are respectively arranged on both sides of a first row of pixels, the first gate line and the second gate line are respectively connected to at least one pixel in the first row of pixels, and in the first row of pixels, a number of pixels with the first polarity is equal to a number of pixels with the second polarity,
   wherein the first main data line is electrically connected to pixels arranged in four columns, and the first sub data line is electrically connected to pixels arranged in another four columns;
   in odd-numbered rows of pixels, the first main data line and the first sub data line are electrically connected to pixels arranged in two columns of the corresponding four columns; and
   in even-numbered rows of pixels, the first main data line and the first sub data line are electrically connected to pixels arranged in the other two columns of the corresponding four columns.

2. The display panel according to claim 1, wherein the first main data line alternately connects pixels arranged in a first column and pixels arranged in a second column, and the first sub data line alternately connects pixels arranged in an N-th column and pixels arranged in an (N+1)th column; and
   the second main data line alternately connects the pixels arranged in the second column and pixels arranged in a third column, and the second sub data line alternately connects the pixels arranged in the (N+1)th column and the columns pixels in arranged in an (N+2)th column, wherein N is a positive integer greater than or equal to 1, N+2 is not greater than M, and M is greater than or equal to 3.

3. The display panel according to claim 2, wherein the first main data line connects a pixel arranged in the first row and the second column and a pixel arranged in a second row and the first column, and the second main data line connects a pixel arranged in the first row and the third column and a pixel arranged in the second row and the second column.

4. The display panel according to claim 1, wherein in the odd-numbered rows of pixels, the first main data line is electrically connected to the pixels arranged in second and third columns of the corresponding four columns, and the first sub data line is electrically connected to the pixels arranged in first and fourth columns of the corresponding four columns; and in the even-numbered rows of pixels, the first main data line is electrically connected to the pixels arranged in first and fourth columns of the corresponding four columns, and the first sub data line is electrically connected to the pixels arranged in second and third columns of the corresponding four columns.

5. The display panel according to claim 4, wherein the second main data line is electrically connected to pixels arranged in four columns, and the second sub data line is electrically connected to pixels arranged in another four columns;

in the odd-numbered rows of pixels, the second main data line and the second sub data line are electrically connected to pixels arranged in two columns of the corresponding four columns; and in the even-numbered rows of pixels, the second main data line and the second sub data line are electrically connected to the pixels arranged in the other two columns of the corresponding four columns.

6. The display panel according to claim 5, wherein the first main data line is electrically connected to pixels arranged in an X-th column, an (X+1)th column, an (X+2)th column, and an (X+3)th column, and the second main data line is electrically connected to pixels arranged in the (X+2)th column, the (X+3)th column, an (X+4)th column, and an (X+5)th column;

in the odd-numbered rows of pixels, the first main data line is electrically connected to the pixels arranged in the (X+1)th column and the (X+2)th column, and the second main data line is electrically connected to the pixels arranged in the (X+3)th column and the (X+5)th column; and in the even-numbered rows of pixels, the first main data line is electrically connected to the pixels arranged in the X-th column and the (X+3)th column, and the second main data line is electrically connected to the pixels arranged in the (X+2)th column and the (X+4)th column, wherein X+5 is not greater than M, and M is greater than or equal to 6.

7. The display panel of claim 1, further comprising:
a source driver; and
a wiring connecting the source driver and the first main data line, wherein the first connecting line is disposed between one end of the wiring and the first row of pixels, and the end is a connecting end of the wiring and the first main data line.

8. A display panel, comprising:
a plurality of pixels arranged in an array along a row direction and a column direction;

a first main data line extending along the column direction, wherein the first main data line is electrically connected to pixels arranged in at least two columns;
a first sub data line extending along the column direction, wherein the first sub data line and the first main data line are separated by M columns of pixels, and the first sub data line is electrically connected to pixels arranged in at least two other columns, wherein M is a positive integer greater than or equal to 1;
a first connecting line connecting the first main data line and the first sub data line;
a second main data line extending along the column direction and adjacent to the first main data line;
a second sub data line extending along the column direction and adjacent to the first sub data line, wherein the second sub data line and the second main data line are separated by M columns of pixels, and the second main data line and the second sub data line are respectively electrically connected to pixels arranged in at least two columns; and
a second connecting line connecting the second main data line and the second sub data line, wherein the first main data line and the first sub data line are configured to transmit a signal with a first polarity, and the second main data line and the second sub data line are configured to transmit a signal with a second polarity opposite to the first polarity,
wherein the first main data line is electrically connected to pixels arranged in four columns, and the first sub data line is electrically connected to pixels arranged in another four columns;
in odd-numbered rows of pixels, the first main data line and the first sub data line are electrically connected to pixels arranged in two columns of the corresponding four columns; and
in even-numbered rows of pixels, the first main data line and the first sub data line are electrically connected to pixels arranged in the other two columns of the corresponding four columns.

9. The display panel according to claim 8, wherein the first main data line alternately connects pixels arranged in a first column and pixels arranged in a second column, and the first sub data line alternately connects pixels arranged in an N-th column and pixels arranged in an (N+1)th column; and
the second main data line alternately connects the pixels arranged in the second column and pixels arranged in a third column, and the second sub data line alternately connects the pixels arranged in the (N+1)th column and the columns pixels in arranged in an (N+2)th column, wherein N is a positive integer greater than or equal to 1, N+2 is not greater than M, and M is greater than or equal to 3.

10. The display panel according to claim 9, wherein the first main data line connects a pixel arranged in the first row and the second column and a pixel arranged in a second row and the first column, and the second main data line connects a pixel arranged in the first row and the third column and a pixel arranged in the second row and the second column.

11. The display panel according to claim 8, wherein in the odd-numbered rows of pixels, the first main data line is electrically connected to the pixels arranged in second and third columns of the corresponding four columns, and the first sub data line is electrically connected to the pixels arranged in first and fourth columns of the corresponding four columns; and in the even-numbered rows of pixels, the first main data line is electrically connected to the pixels arranged in first and fourth columns of the corresponding four columns, and the first sub data line is electrically connected to the pixels arranged in second and third columns of the corresponding four columns.

12. The display panel according to claim 11, wherein the second main data line is electrically connected to pixels arranged in four columns, and the second sub data line is electrically connected to pixels arranged in another four columns;
   in the odd-numbered rows of pixels, the second main data line and the second sub data line are electrically connected to pixels arranged in two columns of the corresponding four columns; and
   in the even-numbered rows of pixels, the second main data line and the second sub data line are electrically connected to the pixels arranged in the other two columns of the corresponding four columns.

13. The display panel according to claim 12, wherein the first main data line is electrically connected to pixels arranged in an X-th column, an (X+1)th column, an (X+2)th column, and an (X+3)th column, and the second main data line is electrically connected to pixels arranged in the (X+2)th column, the (X+3)th column, an (X+4)th column, and an (X+5)th column;
   in the odd-numbered rows of pixels, the first main data line is electrically connected to the pixels arranged in the (X+1)th column and the (X+2)th column, and the second main data line is electrically connected to the pixels arranged in the (X+3)th column and the (X+5)th column; and
   in the even-numbered rows of pixels, the first main data line is electrically connected to the pixels arranged in the X-th column and the (X+3)th column, and the second main data line is electrically connected to the pixels arranged in the (X+2)th column and the (X+4)th column, wherein X+5 is not greater than M, and M is greater than or equal to 6.

14. The display panel of claim 8, further comprising:
   a source driver; and
   a wiring connecting the source driver and the first main data line, wherein the first connecting line is disposed between one end of the wiring and the first row of pixels, and the end is a connecting end of the wiring and the first main data line.

15. The display panel according to claim 8, further comprising: a plurality of gate lines extending along the row direction, wherein two gate lines are arranged between two adjacent rows of pixels;
   the plurality of gate lines comprise a first gate line and a second gate line, which are respectively arranged on both sides of a first row of pixels, the first gate line and the second gate line are respectively connected to at least one pixel in the first row of pixels; and
   in the first row of pixels, a number of pixels with the first polarity is equal to a number of pixels with the second polarity.

* * * * *